(12) United States Patent
Wang et al.

(10) Patent No.: US 11,578,196 B2
(45) Date of Patent: Feb. 14, 2023

(54) LOW-WATER-VAPOR-PERMEABILITY POLYOLEFIN-ELASTOMER FILM AND METHOD FOR PREPARING THE SAME

(71) Applicant: HANGZHOU FIRST APPLIED MATERIAL CO., LTD., Hangzhou (CN)

(72) Inventors: Long Wang, Hangzhou (CN); Xi Xiong, Hangzhou (CN); Guodong Tang, Hangzhou (CN); Hongbing Hou, Hangzhou (CN); Guangda Zhou, Hangzhou (CN); Jianhua Lin, Hangzhou (CN)

(73) Assignee: HANGZHOU FIRST APPLIED MATERIAL CO., LTD, Hangzhou (CN)

( * ) Notice: Subject to any disclaimer, the term of this patent is extended or adjusted under 35 U.S.C. 154(b) by 327 days.

(21) Appl. No.: 16/607,361

(22) PCT Filed: Mar. 19, 2018

(86) PCT No.: PCT/CN2018/079449
§ 371 (c)(1),
(2) Date: Oct. 23, 2019

(87) PCT Pub. No.: WO2019/136823
PCT Pub. Date: Jul. 18, 2019

(65) Prior Publication Data
US 2020/0347211 A1 Nov. 5, 2020

(30) Foreign Application Priority Data

Jan. 10, 2018 (CN) .................. 201810022942.8

(51) Int. Cl.
| | | |
|---|---|---|
| *C08L 23/08* | (2006.01) | |
| *C08K 3/013* | (2018.01) | |
| *C08K 5/00* | (2006.01) | |
| *C08K 5/14* | (2006.01) | |
| *C08K 5/54* | (2006.01) | |
| *C08L 23/14* | (2006.01) | |
| *C08L 23/18* | (2006.01) | |
| *C08L 23/28* | (2006.01) | |
| *C08L 23/32* | (2006.01) | |
| *C08L 23/36* | (2006.01) | |

(52) U.S. Cl.
CPC .............. *C08L 23/08* (2013.01); *C08K 3/013* (2018.01); *C08K 5/005* (2013.01); *C08K 5/0025* (2013.01); *C08K 5/14* (2013.01); *C08K 5/54* (2013.01); *C08L 23/14* (2013.01); *C08L 23/18* (2013.01); *C08L 23/28* (2013.01); *C08L 23/32* (2013.01); *C08L 23/36* (2013.01); *C08L 2201/14* (2013.01); *C08L 2203/16* (2013.01); *C08L 2203/206* (2013.01); *C08L 2205/02* (2013.01); *C08L 2207/04* (2013.01); *C08L 2312/06* (2013.01); *C08L 2312/08* (2013.01)

(58) Field of Classification Search
None
See application file for complete search history.

(56) References Cited

U.S. PATENT DOCUMENTS

| | | | | |
|---|---|---|---|---|
| 5,851,682 A | * | 12/1998 | Kotani ................. | C08K 5/3492 524/251 |
| 2011/0319566 A1 | * | 12/2011 | Nishijima ........... | C08L 23/0869 525/194 |
| 2014/0360579 A1 | * | 12/2014 | Yoda .................... | C08K 5/5425 136/252 |
| 2016/0340560 A1 | * | 11/2016 | Li ........................... | B32B 9/005 |

FOREIGN PATENT DOCUMENTS

| | | |
|---|---|---|
| CN | 104927686 | 9/2015 |
| CN | 105733457 | 7/2016 |
| CN | 106833406 | 6/2017 |
| CN | 10690888 | 7/2017 |
| EP | 2747150 A1 | 6/2014 |
| JP | 2012233079 A | 11/2012 |
| JP | 2013115211 A | 6/2013 |
| JP | 2015135937 A | 7/2015 |
| JP | 2016117893 A | 6/2016 |
| KR | 20140079660 A | 6/2014 |
| WO | 2013024599 A1 | 2/2013 |

OTHER PUBLICATIONS

Tinuvin 770 DF, technical datasheet, Oct. 2019. (Year: 2019).*
European search report (18899526.0); dated Nov. 23, 2021.
International Search Report (PCT/CN2018/079449); dated Sep. 27, 2018.
First Office Action (2019-571600); dated Dec. 17, 2020.

* cited by examiner

Primary Examiner — Christopher M Rodd
(74) Attorney, Agent, or Firm — W&G Law Group

(57) ABSTRACT

The present disclosure discloses a low-water-vapor-permeability polyolefin-elastomer film and its preparation method. The film comprises: 50-100 mass parts of a matrix resin, 0-40 mass parts of a modified resin, 0.001-2 mass parts of an activator, 0.1-3 mass parts of an organic peroxide, 0.02-5 mass parts of an assistant cross-linker, 0.02-2 mass parts of a silane coupling agent, 0.005-2 mass parts of a light stabilizer, and 0-20 mass parts of a water blocking filler. In the present disclosure, by adding the modified resin and the activator that have an active group, a cross-linking degree and a cross-linking density of the film are improved, and a water-vapor permeability is reduced; by adding the water blocking filler, the water blocking property of the film is further improved, thereby ensuring reliability of the assembly, and prolonging service life of the assembly.

8 Claims, No Drawings

LOW-WATER-VAPOR-PERMEABILITY POLYOLEFIN-ELASTOMER FILM AND METHOD FOR PREPARING THE SAME

TECHNICAL FIELD

The present disclosure relates to the field of photovoltaic encapsulating materials, and particularly, relates to a polyolefin-elastomer film having a low water-vapor permeability and used to encapsulate an electronic device, and a preparation method thereof.

BACKGROUND

As the problems of energy shortage and environment pollution are urgent, it is an evitable trend to search for reproducible and environment-friendly green energy sources. Photovoltaic power generation is a process of converting solar energy into electric energy, and has three great advantages of long service life, clearness and good flexibility, and compared with conventional thermal power generations such as hydraulic power generation and nuclear power generation, it can be easily produced and reproduced, such that it has promising development prospect.

At present, ethylene vinyl acetate copolymer (EVA) is usually adopted as an encapsulating material of photovoltaic assemblies. However, due to the molecular structure of the EVA material, EVA film has several shortcomings such as high water-vapor permeability and poor weather resistance. Along with the development of battery technology, various novel high-efficiency batteries such as N-type battery, PERC battery and double-face battery successively emerge, which raises higher requirements on the property of the encapsulating material. Furthermore, in projects such as the Fishing-Light Complementation Project, the assembly is required to operate in environment with high humidity, and thus the encapsulating material is required to have a lower water-vapor permeability to ensure the long-term high-efficiency operation of the assembly. Those novel high-efficiency batteries or specific water-vapor environment raise higher requirements on the water-vapor blocking property of the encapsulating material. It is urgent to solve the problem how to enhance the water-vapor blocking property of the encapsulating materials to prolong the service life of the photovoltaic assemblies.

If a content of vinyl acetate (VA) in the matrix resin EVA is reduced, the blocking property of the encapsulating material can be correspondingly increased with the decreasing of a proportion of the polar functional groups, leading to a problem of a reduced light transmittance, which is adverse to the improvement of the electric energy production of the photovoltaic battery. In an extreme case, such as disclosed in patent CN106752997A (publication number) and patent CN102863916B (publication number), instead of using a polar-monomer copolymer as the matrix resin, a polymer, which is formed by copolymerizing metallocene-catalyzed ethylene and α-olefin monomer such as butylene, pentylene and octylene, is used as the matrix resin for encapsulating. Since the molecular chain does not contain unsaturated bond, the weather resistance and the water blocking property are obviously better than those of EVA. However, such an improvement approach can merely be realized during the polymerization process, it is impossible to further those properties during manufacturing the encapsulating film.

A conventional method for improving the water blocking property of the encapsulating film is adding a water absorbent into the film, to slow down diffusion of water vapor in the films by physical adsorption or chemical reaction. For example, in patent CN103756579A, an ionic polymer is added, and in patent CN104962216A (publication number), dicyclohexylcarbodiimide and 1-ethyl-(3-dimethylaminopropyl)carbodiimide are added. However, the method has limited effect on improving the water blocking property of the film, and the water blocking effect is absent when the water absorbent has reached saturated absorption or completely reacted with the water, and thus a long-term reliability of the assembly can not be ensured.

Accordingly, it is very urgent to provide a novel film having a low water-vapor permeability, which can ensure a long-term high-efficiency operation of the photovoltaic assemblies.

SUMMARY

The present disclosure aims to overcome the defects in the related art, by providing a cross-linked polyolefin-elastomer encapsulating film that has a low water-vapor permeability. The peroxide and the assistant cross-linker can initiate a cross-linking of the polyolefin-elastomer, and by adding the polyolefin-elastomer containing an active group and the activator, a cross-linking density and a cross-linking degree of the film are further improved, and additionally, the water blocking filler helps in the high-efficiency water blocking property of the film. The present disclosure is not only suitable for transparent alkene films, but is also suitable for colored films. Regarding the colored films, in addition to peroxide cross-linking system, the films can be pre-treated with ultraviolet radiation cross-linking or electron radiation cross-linking, to improve the cross-linking degree and the cross-linking density of the films, thereby further improving the water blocking property of the films. The polyolefin-elastomer encapsulating film prepared according to the present disclosure has ultra-low water-vapor permeability and excellent weather resistance, thereby reliably supporting outdoor long-term high-efficiency operation of the assembly.

The object of the present disclosure is realized by the following technical solution: a low-water-vapor-permeability polyolefin-elastomer film for encapsulating an electronic device, including 50-100 mass parts of a matrix resin, 0-40 mass parts of a modified resin, 0.001-2 mass parts of an activator, 0.1-3 mass parts of an organic peroxide, 0.02-5 mass parts of an assistant cross-linker, 0.02-2 mass parts of a silane coupling agent, 0.005-2 mass parts of a light stabilizer, and 0-20 mass parts of a water blocking filler.

Further, the film has a thickness of 0.01-1 mm.

Further, the matrix resin is composed of one or more polymers, mixed in any ratio, which are formed by copolymerizing ethylene with any one of propylene, butylene, pentylene, hexylene and octylene, and a melt index of the matrix resin is 0.5-45 g/10 min.

Further, the modified resin is composed of one or more, mixed in any ratio, of modified resins having the following structural formulas (1)-(14):

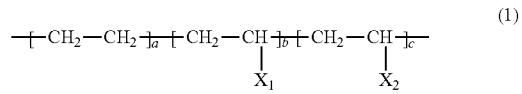

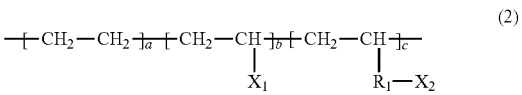

-continued

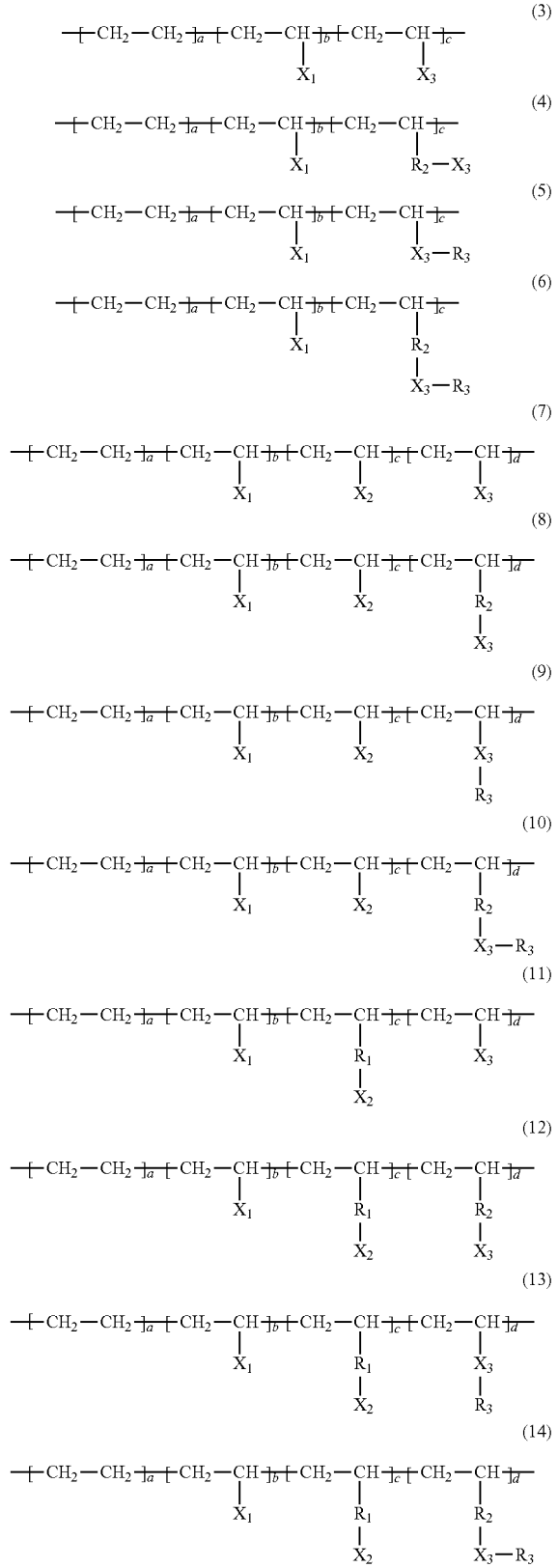

wherein a, b, c and d are natural numbers, $X_1$ is selected from the group consisting of methyl, ethyl, propyl, butyl and hexyl; $R_1$, $R_2$ and $R_3$ are each independently alkyl having 1-10 carbon atoms; $X_2$ and $X_3$ are active groups capable of participating in a cross-linking reaction, which are introduced into a molecular chain of the polyolefin-elastomer by copolymerizing monomers containing $X_2$ and $X_3$ or by a grafting reaction initiated by a free radical; the $X_2$ is selected from the group consisting of halogen, amino, carboxyl, hydroxyl, aldehyde group, mercapto, anhydride group, acrylamido, sulfo, epoxy group, cyano, isocyanate group, carbon-carbon double bond, carbon-carbon triple bond and acyl chloride group, with a content of 0.05%-15 wt %; and the $X_3$ is selected from imino, phosphodiester group, carbon-carbon double bond and carbon-carbon triple bond, with a content of 0.05%-15 wt %.

Further, the activator contains two or more active groups, wherein the active groups are selected from halogen, carboxyl, amino, hydroxyl, mercapto, anhydride group, acrylamido, isocyanate group, aldehyde group, sulfo, silane coupling group and acyl chloride group.

Further, the organic peroxide is composed of one or more, mixed in any ratio, of tert-butyl peroxy isopropyl carbonate, 2,5-dimethyl-2,5-(bis-tert-butylperoxy)hexane, 2-ethylhexyl tert-butyl peroxy isopropyl carbonate, 1,1-bis(tert-butylperoxy)-3,3,5-trimethylcyclohexane, 1,1-bis(tert-pentylperoxy)-3,3,5-trimethylcyclohexane, 1,1-bis(tert-pentylperoxy)cyclohexane, 1,1-bis(tert-butylperoxy) cyclohexane, 2,2-bis(tert-butylperoxy)butane, tert-pentyl 2-ethylhexylcarbonate, 2,5-dimethyl-2,5-bis(benzoylperoxy)-hexane, tert-pentylperoxy carbonate, and tert-butylperoxy 3,3,5-trimethylhexanoate; the assistant cross-linker is composed of one or more, mixed in any ratio, of triallylisocyanurate, triallyl cyanurate, trimethylolpropane triacrylate, trimethylolpropane trimethacrylate, pentaerythritol triacrylate, tris(2-hydroxyethyl)isocyanurate triacrylate, ethoxylated trimethylolpropane triacrylate, propoxylated trimethylolpropane triacrylate, ethoxylated glyceryl triacrylate, propoxylated glyceryl triacrylate, pentaerythritol tetraacrylate, ethoxylated pentaerythritol tetraacrylate, trimethylolpropane tetraacrylate, bistrimethylolpropane tetraacrylate, bistrimethylolpropane tetramethylacrylate, propoxylated pentaerythritol tetraacrylate, 2,4,6-tri s(2-propenyloxy)-1,3,5-triazine, tricyclodecane bimethanol diacrylate, neopentyl glycol diacrylate propoxide, ethoxylated bisphenol A diacrylate, ethoxylated bisphenol A dimethacrylate, 2-butyl-2-ethyl-1,3-propane glycol diacrylate, diethylene glycol dimethacrylate, triethylene glycol dimethacrylate, and polyethylene glycol dimethacrylate; the silane coupling agent is composed of one or more, mixed in any ratio, of vinyl triethoxysilane, vinyl trimethoxysilane, vinyl tri-tert-butylperoxy silane, vinyl triacetoxysilane, vinyl tris (β-methoxyethoxy)silane, γ-aminopropyltriethoxysilane, γ-methylacryloyloxypropyltrimethoxysilane, γ-glycidyloxypropyltrimethylsilane, and 3-aminopropyltrimethylsilane; and the light stabilizer is composed of one or more, mixed in any ratio, of bis(2,2,6,6-tetramethyl-4-piperidinyl) sebacate, bis(1-octyloxy-2,2,6,6-tetramethyl-4-piperidinyl) sebacate, a graft polymer obtained by polymerizing 4-(methyl)acryloyloxy-2,2,6,6-tetramethylpiperidine with α-olefin monomer, 4-hydroxyl-2,2,6,6-tetramethyl-1-piperidinol, hexadecyl 3,5-bis(tert-butyl)-4-hydroxybenzoate, bis-2,2,6,6-tetramethylpiperidyl sebacate and tris(1,2,2,6,6-pentamethyl-4-piperidinyl) phosphite.

Further, the water blocking filler is a porous absorptive material or a compound that is able to absorb water vapor to form crystal water.

Further, the water blocking filler is composed of one or more, mixed in any ratio, of molecular sieve, zeolite, diatomite, activated carbon, porous silicon dioxide, porous aluminium oxide, carbon black, calcium oxide, calcium carbonate, calcium chloride, magnesium sulfate, magnesium chloride, copper sulfate, sodium sulfate, calcium sulfate, zinc sulfate and calcium hydroxide.

A method for preparing the low-water-vapor-permeability polyolefin-elastomer film described above, the method comprises: weighing 50-100 mass parts of a matrix resin, 0-40 mass parts of a modified resin, 0.001-2 mass parts of an activator, 0.1-3 mass parts of an organic peroxide, 0.02-5 mass parts of an assistant cross-linker, 0.02-2 mass parts of a silane coupling agent, 0.005-2 mass parts of a light stabilizer and 0-20 mass parts of the water blocking filler; mixing all the foresaid components and adding the obtained mixture into an extruder; and forming a film by film casting method using a T-shaped die head to obtain the low-water-vapor-permeability polyolefin-elastomer film.

Further, after said forming the film by film casting method using a T-shaped die head, the film is treated with ultraviolet light at an irradiation dosage of 0.01-0.1 kWh/m$^2$ or with an electron beam of an irradiation dosage at 0.2-100 KGY, to enable the matrix resin and the modified resin to have a cross-linking reaction or a grafting reaction with the activator, the organic peroxide and the assistant cross-linker.

The beneficial effects of the present disclosure are described as follow. The present disclosure is not limited to the polyolefin-elastomer system, and is also suitable for EVA film, PE film and EMMA film. By adding the modified resin and the activator, the cross-linking density and the cross-linking degree of the film can be improved, and additionally, by adding the suitable water blocking filler, the water blocking property of the high-molecular material can be greatly improved. Two or more of the matrix resin, the activator, the cross-linking agent and the organic peroxide can react to increase the blocking property.

DESCRIPTION OF EMBODIMENTS

The present disclosure will be further described below with reference with the particular examples, and the protection scope of the present disclosure is not limited to these examples.

Example 1

The present example includes the following mass parts of components: 80 parts of polyolefin-elastomer having a melt index of 5 g/10 min, mark C5070D (SABIC Innovative Plastics), 20 parts of ethylene-octylene copolymer modified resin containing 2.5% of amino, 0.26 part of ethanedioic acid, 0.65 part of isopropyl tert-butylperoxycarbonate, 0.6 part of triallylisocyanurate, 0.5 part of vinyl triethoxysilane, 0.04 part of hexadecyl 3,5-bis(tert-butyl)-4-hydroxybenzoate, and 0.2 part of molecular sieve, and is labeled as S-1.

Example 2

The present example includes the following mass parts of components: 65 parts of polyolefin-elastomer having a melt index of 15 g/10 min, mark C13060D (SABIC Innovative Plastics), 35 parts of ethylene-pentylene copolymer modified resin containing 1.0% of carboxyl, 0.20 part of 1,4-butanediamine, 0.40 part of tert-butyl 3,3,5-trimethylhexanoate peroxide, 0.35 part of triallylisocyanurate B, 0.5 part of vinyl trimethoxysilane, 0.08 part of 4-hydroxyl-2,2,6,6-tetramethyl-1-piperidinol, and 0.25 part of silicon dioxide, and is labeled as S-2.

Example 3

The present example includes the following mass parts of components: 80 parts of polyolefin-elastomer having a melt index of 30 g/10 min, mark C30070D (SABIC Innovative Plastics), 20 parts of ethylene-butylene copolymer modified resin containing 2.0% of isocyanate group, 0.22 part of 1,3-propylene glycol, 0.65 part of 1,1-bis(peroxytert-butyl)-3,3,5-trimethylcyclohexane, 0.6 part of triallylisocyanurate, 0.5 part of vinyl triethoxysilane, 0.02 part of 4-hydroxyl-2,2,6,6-tetramethyl-1-piperidinol, and 0.2 part of magnesium sulfate, and is labeled as S-3.

Example 4

The present example includes the following mass parts of components: 60 parts of polyolefin-elastomer having a melt index of 0.5 g/10 min, mark 8150 (Dow), 40 parts of ethylene-hexylene copolymer modified resin containing 0.2% of isocyanate group, 0.30 part of 1,4-butanedioic acid, 0.35 part of 1,1-bis(peroxytert-butyl)-3,3,5-trimethylcyclohexane, 0.3 part of trimethylolpropane triacrylate, 0.5 part of vinyl trimethoxysilane, 0.005 part of hexadecyl 3,5-bis(tert-butyl)-4-hydroxybenzoate, and 0.2 part of calcium chloride, and is labeled as S-4.

Example 5

The present example includes the following mass parts of components: 60 parts of polyolefin-elastomer having a melt index of 5 g/10 min, mark 8200 (Dow), 40 parts of ethylene-pentylene copolymer modified resin containing 1.0% of hydroxyl, 2.0 parts of 1,5-pentanedisulfonic acid, 0.1 part of 2-ethylhexyl tert-butylperoxycarbonate, 0.02 part of pentaerythritol tetraacrylate, 0.8 part of vinyl triacetoxysilane, 0.5 part of molecular sieve, and 0.02 part of hexadecyl 3,5-bis(tert-butyl)-4-hydroxybenzoate, and is labeled as S-5.

Example 6

The present example includes the following mass parts of components: 60 parts of polyolefin-elastomer having a melt index of 5 g/10 min, mark 8200 (Dow), 40 parts of ethylene-pentylene copolymer modified resin containing 1.0% of hydroxyl, 0.22 part of toluene diisocynate, 0.55 part of tert-butyl 3,3,5-trimethylhexanoate, 0.5 part of trimethylolpropane triacrylate, 1.0 part of vinyltrimethoxysilane, 0.07 part of 4-hydroxyl-2,2,6,6-tetramethyl-1-piperidinol, and 0.5 part of calcium sulfate, and is labeled as S-6.

Example 7

The present example includes the following mass parts of components: 70 parts of a mixture of polyolefin-elastomer having a melt index of 20 g/10 min 8200 (Dow) and C30070D (SABIC Innovative Plastics), 30 parts of ethylene-butylene copolymer modified resin containing 1.5% of hydroxyl, 0.24 part of 1,6-hexanedioic acid, 0.55 part of 2-ethylhexyl tert-butylperoxycarbonate, 0.5 part of pentaerythritol tetraacrylate, 0.5 part of vinyltrimethoxysilane, 0.05 part of hexadecyl 3,5-bis(tert-butyl)-4-hydroxybenzoate, and 0.5 part of magnesium chloride, and is labeled as S-7.

Example 8

The present example includes the following mass parts of components: 60 parts of a mixture of polyolefin-elastomer having a melt index of 15 g/10 min 8402 (Dow) and 8200 (Dow), 40 parts of ethylene-octylene copolymer modified resin containing 1.5% of sulfo, 0.30 part of 3-amino-1-butanol, 0.5 part of 2-ethylhexyl tert-butylperoxycarbonate, 0.5 part of trimethylolpropane triacrylate, 0.4 part of vinyltriethoxysilane, 0.05 part of 4-hydroxyl-2,2,6,6-tetramethyl-1-piperidinol, and 0.15 part of sodium sulfate, and is labeled as S-8.

Example 9

The present example includes the following mass parts of components: 70 parts of a mixture of polyolefin-elastomer having a melt index of 10 g/10 min 8402 (Dow) and 8200 (Dow), 30 parts of ethylene-octylene copolymer modified resin containing 1.5% of sulfo, 0.30 part of 1,3-diallylurea, 0.5 part of 2-ethylhexyl tert-butylperoxycarbonate, 0.5 part of trimethylolpropane triacrylate ethoxide, 0.3 part of vinyl triacetoxysilane, 2 parts of hexadecyl 3,5-bis(tert-butyl)-4-hydroxybenzoate, and 0.2 part of magnesium sulfate, and is labeled as S-9.

Example 10

The present example includes the following mass parts of components: 95 parts of a mixture of polyolefin-elastomer having a melt index of 10 g/10 min 8402 (Dow) and 8200 (Dow), 5 parts of ethylene-octylene copolymer modified resin containing 2.0% of sulfo, 0.001 part of 1,4-hexanedithiol, 0.5 part of 1,1-bis(tert-butylperoxy)cyclohexane, 0.5 part of triallylisocyanurate ethoxide, 0.3 part of vinyl trimethoxysilane, 0.09 part of 4-hydroxyl-2,2,6,6-tetramethyl-1-piperidinol, and 0.2 part of calcium chloride, and is labeled as S-10.

Example 11

The present example includes the following mass parts of components: 90 parts of a mixture of polyolefin-elastomer having a melt index of 20 g/10 min 8200 (Dow) and C30070D (SABIC Innovative Plastics), 10 parts of ethylene-octylene copolymer modified resin containing 0.1% of acyl chloride group, 0.08 part of 4-amino-1-butyric acid, 0.5 part of 2-ethylhexyl tert-butylperoxycarbonate, 0.5 part of trimethylolpropane trimethacrylate, 0.2 part of vinyl triethoxysilane, 0.08 part of hexadecyl 3,5-bis(tert-butyl)-4-hydroxybenzoate, 0.1 part of calcium chloride, and 0.1 part of magnesium sulfate, and is labeled as S-11.

Example 12

The present example includes the following mass parts of components: 60 parts of a mixture of polyolefin-elastomer having a melt index of 10 g/10 min 8200 (Dow) and 8402 (Dow), 40 parts of ethylene-octylene copolymer modified resin containing 0.1% of acyl chloride group, 0.95 part of ethanedioic acid, 0.5 part of 2-ethylhexyl tert-butylperoxycarbonate, 0.5 part of trimethylolpropane trimethacrylate, 2.0 parts of vinyl trimethoxysilane, and 1.2 parts of hexadecyl 3,5-bis(tert-butyl)-4-hydroxybenzoate, and is labeled as S-12.

Example 13

This example comprises the following mass parts of components: 70 parts of polyolefin-elastomer having a melt index of 5 g/10 min, mark 8200 (Dow), 30 parts of ethylene-octylene copolymer modified resin containing 3.0% of anhydride group, 0.65 part of 1,4-butane glycol, 0.5 part of 2-ethylhexyl tert-butylperoxycarbonate, 0.5 part of trimethylolpropane trimethacrylate, 0.6 part of vinyl triacetoxysilane, 1.0 part of 4-hydroxyl-2,2,6,6-tetramethyl-1-piperidinol, 0.1 part of calcium carbonate, and 0.1 part of magnesium sulfate, and is labeled as S-13.

Example 14

The present example includes the following mass parts of components: 70 parts of polyolefin-elastomer having a melt index of 5 g/10 min, mark 8200 (Dow), 30 parts of an ethylene-octylene copolymer modified resin containing 3.0% of anhydride group, 0.65 part of 4-amino-1-butanol, 0.5 part of 2-ethylhexyl tert-butylperoxycarbonate, 0.5 part of trimethylolpropane trimethacrylate, 0.3 part of vinyl triacetoxysilane, 0.02 part of 4-hydroxyl-2,2,6,6-tetramethyl-1-piperidinol, and 0.2 part of molecular sieve, and is labeled as S-14.

Example 15

The present example includes the following mass parts of components: 70 parts of a mixture of polyolefin-elastomer having a melt index of 15 g/10 min 8200 (Dow) and 8402 (Dow), 30 parts of ethylene-octylene copolymer modified resin containing 3.0% of sulfo, 0.65 part of p-benzenediamide, 0.5 part of 2-ethylhexyl tert-butyl peroxy isopropyl carbonate, 0.5 part of trimethylolpropane trimethacrylate, 0.3 part of vinyl triacetoxysilane, 0.02 part of 4-hydroxyl-2,2,6,6-tetramethyl-1-piperidinol, and 0.2 part of molecular sieve, and is labeled as S-15.

Example 16

The present example includes the following mass parts of components: 60 parts of a mixture of polyolefin-elastomer having a melt index of 20 g/10 min 8200 (Dow) and C30070D (SABIC Innovative Plastics), 30 parts of ethylene-octylene copolymer modified resin containing 3.0% of anhydride group, 0.65 part of 1,4-butane glycol, 0.5 part of 2-ethylhexyl tert-butyl peroxy isopropyl carbonate, 0.5 part of trimethylolpropane trimethacrylate, 0.2 part of vinyl triethoxysilane, 0.06 part of hexadecyl 3,5-bis(tert-butyl)-4-hydroxybenzoate, 4 parts of aluminium oxide, and 6 parts of calcium carbonate, and is labeled as S-16.

Example 17

The present example includes the following mass parts of components: 50 parts of polyolefin-elastomer having a melt index of 5 g/10 min, mark 8200 (Dow), 40 parts of ethylene-octylene copolymer modified resin containing 1.5% of isocyanate group, 0.25 part of 1,6-hexanedithiol, 0.5 part of 2-ethylhexyl tert-butyl peroxy isopropyl carbonate, 0.5 part of trimethylolpropane trimethacrylate, 0.2 part of vinyl trimethoxysilane, 0.08 part of hexadecyl 3,5-bis(tert-butyl)-4-hydroxybenzoate, 10 parts of silicon dioxide, 5 parts of calcium chloride, and 5 parts of calcium carbonate, and is labeled as S-17.

Example 18

The present example includes the following mass parts of components: 70 parts of a mixture of polyolefin-elastomer having a melt index of 20 g/10 min 8200 (Dow) and C30070D (SABIC Innovative Plastics), 30 parts of ethylene-octylene copolymer modified resin containing 3.0% of sulfo, 0.50 part of 1,4-butanediamine, 0.3 part of 2-ethylhexyl tert-butyl peroxy isopropyl carbonate, 0.3 part of trimethylolpropane trimethacrylate, 0.2 part of vinyl trimethoxysilane, 0.09 part of hexadecyl 3,5-bis(tert-butyl)-4-hydroxybenzoate, and 0.5 part of carbon black, and is labeled as S-18.

Example 19

The present example includes the following mass parts of components: 100 parts of polyolefin-elastomer having a melt index of 5 g/10 min, mark 8200 (Dow), 0.26 part of ethanedioic acid, 0.65 part of isopropyl tert-butyl peroxy isopropyl carbonate, 0.6 part of triallylisocyanurate, 0.5 part of vinyl triethoxysilane, 0.06 part of 4-hydroxyl-2,2,6,6-tetramethyl-1-piperidinol, and 0.2 part of molecular sieve, and is labeled as S-19.

Example 20

The present example includes the following mass parts of components: 100 parts of polyolefin-elastomer having a melt index of 5 g/10 min, mark 8200 (Dow), 0.26 part of 1,3-propylene glycol, 0.65 part of isopropyl tert-butyl peroxy isopropyl carbonate, 0.6 part of triallylisocyanurate, 0.5 part of vinyl triacetoxysilane, 0.05 part of 4-hydroxyl-2,2,6,6-tetramethyl-1-piperidinol, and 0.2 part of molecular sieve, and is labeled as S-20.

Comparative Example 1

The present example includes the following mass parts of components: 100 parts of polyolefin-elastomer having a melt index of 5 g/10 min, mark C5070D (SABIC Innovative Plastics) 0.65 part of isopropyl tert-butyl peroxy isopropyl carbonate, 0.6 part of triallylisocyanurate, 0.5 part of vinyl trimethoxysilane, 0.08 part of hexadecyl 3,5-bis(tert-butyl)-4-hydroxybenzoate, and 0.2 part of molecular sieve, and is labeled as C-1.

Comparative Example 2

The present example includes the following mass parts of components: 80 parts of polyolefin-elastomer having a melt index of 5 g/10 min, mark 8200 (Dow), 20 parts of ethylene-butylene copolymer modified resin containing 2.5% of amino, 0.65 part of isopropyl tert-butyl peroxy isopropyl carbonate, 0.6 part of triallylisocyanurate, 0.5 part of vinyl triethoxysilane, 0.05 part of hexadecyl 3,5-bis(tert-butyl)-4-hydroxybenzoate, and 0.2 part of molecular sieve, and is labeled as C-2.

Comparative Example 3

The present example includes the following mass parts of components: 100 parts of ethylene vinyl acetate having a melt index of 25 g/10 min, 0.65 part of isopropyl tert-butyl peroxy isopropyl carbonate, 0.6 part of triallylisocyanurate, 0.5 part of vinyl triethoxysilane, 0.06 part of 4-hydroxyl-2,2,6,6-tetramethyl-1-piperidinol, and 0.2 part of molecular sieve, and is labeled as C-5.

Comparative Example 4

The present example includes the following mass parts of components: 90 parts of ethylene vinyl acetate having a melt index of 25 g/10 min, 0.65 part of isopropyl tert-butyl peroxy isopropyl carbonate, 0.6 part of triallylisocyanurate, 0.5 part of vinyl triethoxysilane, 0.07 part of 4-hydroxyl-2,2,6,6-tetramethyl-1-piperidinol, 4 parts of titanium dioxide, and 6 parts of calcium chloride, and is labeled as C-6.

The components of the above examples and comparative examples are mixed in the said ratios, added into an extruder, are extruded precisely by using a screw, and curtain-coated a film by using a T-shaped die head. For the sake of comparing, all films formed by the curtain-coating have a thickness of 0.5 mm in the above examples.

The encapsulating films obtained in the examples are used to encapsulate solar cell assemblies, which are evaluated by using the following testing method, and the evaluation results are listed in Table 1:

1. Cross-linking degrees of the encapsulating films

The testing method refers to Standard GB/T 29848 "Ethylene-Vinyl Acetate Copolymer (EVA) Film for Encapsulating Photovoltaic Assembly".

2. Water-vapor permeability

The testing method refers to the Standard GB/T 29848 "Ethylene-Vinyl Acetate Copolymer (EVA) Film for Encapsulating Photovoltaic Assembly"

3. Constant anti-wet heat aging property

The testing method refers to the Standard GB/T 29848 "Ethylene-Vinyl Acetate Copolymer (EVA) Film for Encapsulating Photovoltaic Assembly", in which a test temperature is 85° C., a test relative humidity is 85%, and an aging duration is 1000 h. The yellowing indexes ($\Delta YI$) were measured before and after the test according to National Standard GB 2409 "Plastics Yellow Index Test Method".

TABLE 1

Summary of test results on samples of example and comparative examples

| Sample | Cross-linking degree after lamination (%) | Thickness (mm) | Water-vapor permeability (g/m² · day) | $\Delta YI$ after wet-heat aging |
|---|---|---|---|---|
| S-1 | 88.8 | 0.50 | 0.68 | 0.32 |
| S-2 | 89.3 | 0.51 | 0.72 | 0.41 |
| S-3 | 90.2 | 0.50 | 0.72 | 0.36 |
| S-4 | 91.3 | 0.51 | 0.62 | 0.33 |
| S-5 | 91.5 | 0.51 | 0.58 | 0.45 |
| S-6 | 90.8 | 0.50 | 0.61 | 0.38 |
| S-7 | 90.1 | 0.50 | 0.53 | 0.42 |
| S-8 | 91.3 | 0.50 | 0.50 | 0.35 |
| S-9 | 88.8 | 0.51 | 0.48 | 0.52 |
| S-10 | 85.9 | 0.51 | 1.80 | 0.88 |
| S-11 | 89.2 | 0.50 | 0.64 | 0.78 |
| S-12 | 90.1 | 0.49 | 0.62 | 0.62 |
| S-13 | 87.6 | 0.50 | 0.71 | 0.47 |
| S-14 | 86.9 | 0.50 | 0.59 | 0.49 |
| S-15 | 89.7 | 0.50 | 0.61 | 0.52 |
| S-16 | 91.0 | 0.50 | 0.64 | 0.57 |
| S-17 | 90.7 | 0.49 | 1.1 | 0.58 |
| S-18 | 76.3 | 0.51 | 2.3 | 1.25 |
| S-19 | 75.2 | 0.50 | 2.4 | 1.38 |
| C-1 | 75.3 | 0.50 | 3.5 | 1.02 |
| C-2 | 78.2 | 0.51 | 2.5 | 1.14 |
| C-3 | 84.6 | 0.50 | 25.2 | 1.08 |
| C-4 | 86.3 | 0.49 | 21.3 | 2.31 |

The test results indicate that, the polyolefin-elastomer film prepared according to the technical solution of the present disclosure has an extremely low water-vapor permeability and an excellent weather resistance, and thus is an ideal high-molecular encapsulating material and can be used for encapsulating photovoltaic assemblies, electronic devices, display devices, and the like. The results verify that, the cross-linking density and the cross-linking degree of the film can be improved by introducing the active resin and the activator that have an active group to initiate the reaction of the active groups, thereby improving the water blocking property of the material. In addition, by cooperating with a proper water blocking filler, an encapsulating material having an excellent water blocking property can be obtained. Such a method is not only suitable for polyolefin-elastomer films, but can also be extensively applied in materials such as EVA, EMMA, and the like. It can enhance the water blocking property of the material and improve the weather resistance of the material at the same time. It can be used for preparing transparent films, or colored films, such as black and white films.

What is claimed is:

1. A polyolefin elastomer film for encapsulating an electronic device, wherein the film comprises: 50-100 mass parts of a matrix resin, 5-40 mass parts of a modified resin, 0.001-2 mass parts of an activator, 0.1-3 mass parts of an organic peroxide, 0.02-5 mass parts of an assistant cross-linker, 0.02-2 mass parts of a silane coupling agent, 0.005-2 mass parts of a light stabilizer, and 0-20 mass parts of a water blocking filler;

the matrix resin is a polyolefin elastomer;

the modified resin is composed of one or more, mixed in any ratio, of modified resins having the following structural formulas (1)-(14):

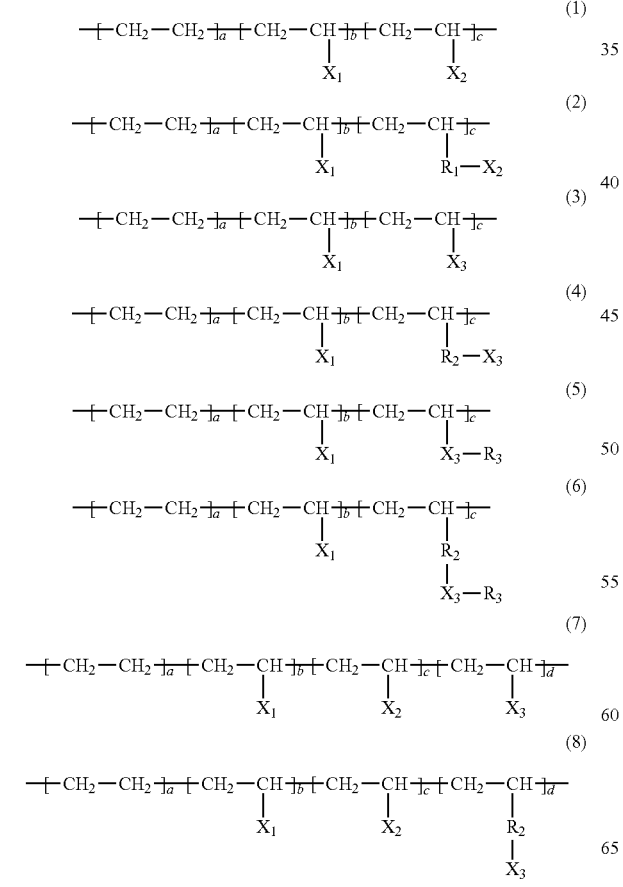

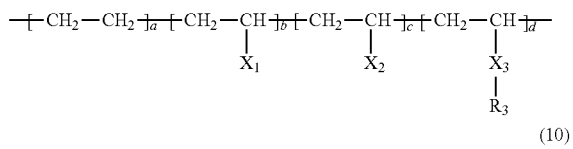

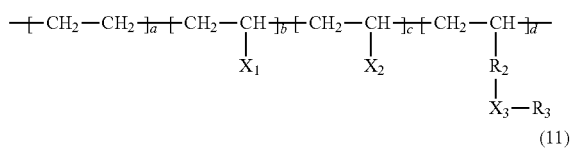

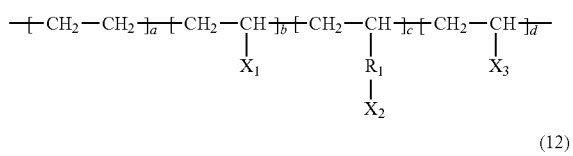

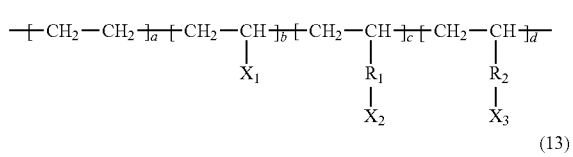

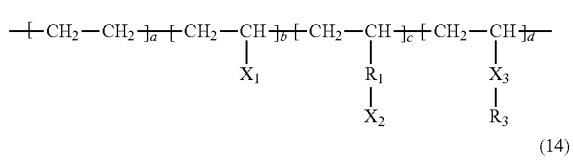

wherein a, b, c and d are natural numbers, $X_1$ is selected from the group consisting of methyl, ethyl, propyl, butyl and hexyl; $R_1$, $R_2$ and $R_3$ are each independently alkyl having 1-10 carbon atoms; $X_2$ and $X_3$ are active groups capable of participating in a cross-linking reaction, which are introduced into a molecular chain of the polyolefin elastomer by copolymerizing monomers containing $X_2$ and $X_3$ or by a grafting reaction initiated by a free radical; the $X_2$ is selected from the group consisting of halogen, amino, carboxyl, hydroxyl, aldehyde group, mercapto, anhydride group, acrylamido, sulfo, epoxy group, cyano, isocyanate group, carbon-carbon double bond, carbon-carbon triple bond and acyl chloride group, with a content of 0.05%-15 wt %; and the $X_3$ is selected from imino, phosphodiester group, carbon-carbon double bond and carbon-carbon triple bond, with a content of 0.05%-15 wt %; and the activator contains two or more active groups, wherein the active groups are selected from halogen, carboxyl, amino, hydroxyl, mercapto, anhydride group, acrylamido, isocyanate group, aldehyde group, sulfo, silane coupling group and acyl chloride group.

2. The polyolefin elastomer film according to claim 1, wherein the film has a thickness of 0.01-1 mm.

3. The polyolefin elastomer film according to claim 1, wherein the matrix resin is composed of one or more polymers, mixed in any ratio, which are formed by copolymerizing ethylene with any one of propylene, butylene, pentylene, hexylene and octylene, and a melt index of the matrix resin is 0.5-45 g/10 min.

4. The polyolefin elastomer film according to claim 1, wherein the organic peroxide is composed of one or more, mixed in any ratio, of tert-butyl peroxy isopropyl carbonate, 2,5-dimethyl-2,5-(bis-tert-butylperoxy)hexane, 2-ethylhexyl tert-butyl peroxy isopropyl carbonate, 1,1-bis(tert-butylperoxy)-3,3,5-trimethylcyclohexane, 1,1-bis(tert-pentylperoxy)-3,3,5-trimethylcyclohexane, 1,1-bis(tert-pentylperoxy)cyclohexane, 1,1-bis(tert-butylperoxy)cyclohexane, 2,2-bis(tert-butylperoxy)butane, tert-pentyl 2-ethylhexylcarbonate, 2,5-dimethyl-2,5-bis(benzoylperoxy)-hexane, tert-pentylperoxy carbonate, and tert-butylperoxy 3,3,5-trimethylhexanoate;

the assistant cross-linker is composed of one or more, mixed in any ratio, of triallylisocyanurate, triallyl cyanurate, trimethylolpropane triacrylate, trimethylolpropane trimethacrylate, pentaerythritol triacrylate, tris(2-hydroxyethyl)isocyanurate triacrylate, ethoxylated trimethylolpropane triacrylate, propoxylated trimethylolpropane triacrylate, ethoxylated glyceryl triacrylate, propoxylated glyceryl triacrylate, pentaerythritol tetraacrylate, ethoxylated pentaerythritol tetraacrylate, trimethylolpropane tetraacrylate, bistrimethylolpropane tetraacrylate, bistrimethylolpropane tetramethylacrylate, propoxylated pentaerythritol tetraacrylate, 2,4,6-tri s(2-propenyloxy)-1,3,5-triazine, tricyclodecane bimethanol diacrylate, neopentyl glycol diacrylate propoxide, ethoxylated bisphenol A diacrylate, ethoxylated bisphenol A dimethacrylate, 2-butyl-2-ethyl-1,3-propane glycol diacrylate, diethylene glycol dimethacrylate, triethylene glycol dimethacrylate, and polyethylene glycol dimethacrylate;

the silane coupling agent is composed of one or more, mixed in any ratio, of vinyl triethoxysilane, vinyl trimethoxysilane, vinyl tri-tert-butylperoxy silane, vinyl triacetoxysilane, vinyl tris(β-methoxyethoxy)silane, γ-aminopropyltriethoxysilane, γ-methylacryloyloxypropyltrimethoxysilane, γ-glycidyloxypropyltrimethylsilane, and 3-aminopropyltrimethylsilane; and the light stabilizer is composed of one or more, mixed in any ratio, of bis(2,2,6,6-tetramethyl-4-piperidinyl) sebacate, bis(1-octyloxy-2,2,6,6-tetramethyl-4-piperidinyl) sebacate, a graft polymer obtained by polymerizing 4-(methyl)acryloyloxy-2,2,6,6-tetramethylpiperidine with α-olefin monomer, 4-hydroxyl-2,2,6,6-tetramethyl-1-piperidinol, hexadecyl 3,5-bis(tert-butyl)-4-hydroxybenzoate, bis-2,2,6,6-tetramethylpiperidyl sebacate and tri s(1,2,2,6,6-pentamethyl-4-piperidinyl) phosphite.

5. The polyolefin elastomer film according to claim 1, wherein the water blocking filler is a porous absorptive material or a compound that is able to absorb water vapor to form crystal water.

6. The polyolefin elastomer film according to claim 5, wherein the water blocking filler is composed of one or more, mixed in any ratio, of molecular sieve, zeolite, diatomite, activated carbon, porous silicon dioxide, porous aluminium oxide, carbon black, calcium oxide, calcium carbonate, calcium chloride, magnesium sulfate, magnesium chloride, copper sulfate, sodium sulfate, calcium sulfate, zinc sulfate and calcium hydroxide.

7. A method for preparing the polyolefin elastomer film according to claim 1, wherein the method comprises: weighing 50-100 mass parts of a matrix resin, 5-40 mass parts of a modified resin, 0.001-2 mass parts of an activator, 0.1-3 mass parts of an organic peroxide, 0.02-5 mass parts of an assistant cross-linker, 0.02-2 mass parts of a silane coupling agent, 0.005-2 mass parts of a light stabilizer and 0-20 mass parts of the water blocking filler; mixing all the foresaid components and adding the obtained mixture into an extruder; and forming a film by film casting method using a T-shaped die head to obtain the polyolefin elastomer film.

8. The method according to claim 7, wherein, after said forming the film by film casting method using a T-shaped die head, the film is treated with ultraviolet light at an irradiation dosage of 0.01-0.1 kWh/m$^2$ or with an electron beam of an irradiation dosage at 0.2-100 KGY, to enable the matrix resin and the modified resin to have a cross-linking reaction or a grafting reaction with the activator, the organic peroxide and the assistant cross-linker.

* * * * *